United States Patent
Chen et al.

(10) Patent No.: US 7,773,424 B2
(45) Date of Patent: Aug. 10, 2010

(54) CIRCUIT FOR AND AN ELECTRONIC DEVICE INCLUDING A NONVOLATILE MEMORY CELL AND A PROCESS OF FORMING THE ELECTRONIC DEVICE

(75) Inventors: Weize Chen, Phoenix, AZ (US); Patrice M. Parris, Phoenix, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 267 days.

(21) Appl. No.: 12/126,069

(22) Filed: May 23, 2008

(65) Prior Publication Data

US 2009/0290437 A1 Nov. 26, 2009

(51) Int. Cl.
*G11C 11/34* (2006.01)
(52) U.S. Cl. .............. 365/185.18; 365/185.05; 365/185.25; 365/185.26; 365/189.14
(58) Field of Classification Search ............ 365/185.18, 365/185.05, 185.25, 185.26, 189.14; 257/315, 257/324
See application file for complete search history.

(56) References Cited

U.S. PATENT DOCUMENTS

| | | | |
|---|---|---|---|
| 5,043,941 A | 8/1991 | Sakamoto | |
| 5,604,700 A | 2/1997 | Parris et al. | |
| 5,892,709 A | 4/1999 | Parris et al. | |
| 6,028,789 A | 2/2000 | Mehta et al. | |
| 6,307,781 B1 | 10/2001 | Shum | |
| 6,898,123 B2 * | 5/2005 | Owen | 365/185.21 |
| 7,477,546 B2 * | 1/2009 | Fang et al. | 365/185.05 |
| 2004/0195593 A1 | 10/2004 | Diorio et al. | |
| 2008/0054331 A1 * | 3/2008 | Chen et al. | 257/315 |

OTHER PUBLICATIONS

PCT/US2009/038500 International Search Report and Written Opinion mailed Oct. 29, 2009.

* cited by examiner

*Primary Examiner*—Tuan T Nguyen
*Assistant Examiner*—Toan Le (57) ABSTRACT

A circuit for a nonvolatile memory cell can include a charge-altering terminal and an output terminal. The circuit can also include a first transistor having a gate electrode that electrically floats and an active region including a current-carrying electrode, wherein the current-carrying electrode is coupled to the output terminal. The circuit can further include a second transistor having a first electrode and a second electrode, wherein the first electrode is coupled to the gate electrode of the first transistor, and the second electrode is coupled to the charge-altering terminal. When changing the state of the memory cell, the second transistor can be active and no significant amount of charge carriers are transferred between the gate electrode of the first transistor and the active region of the first transistor. Other embodiments can include the electronic device itself and a process of forming the electronic device.

20 Claims, 7 Drawing Sheets

CIRCUIT FOR AN ELECTRONIC DEVICE INCLUDING A NONVOLATILE MEMORY CELL AND A PROCESS OF FORMING THE ELECTRONIC DEVICE

BACKGROUND

1. Field of the Disclosure

The present disclosure relates to circuits for nonvolatile memory cells, electronic devices including nonvolatile memory cells, and processes of forming the electronic devices.

2. Description of the Related Art

Many nonvolatile memory cells are programmed or erased using hot carrier injection (including conventional hot electron injection and source-side injection), Fowler-Nordheim tunneling, or both (e.g., program using hot electron injection and erase using Fowler-Nordheim tunneling). The nonvolatile memory cells can have transistor structures that significantly differ from transistor structures used in transistor-to-transistor logic, which are typically designed to operate at relatively high frequencies. For example, a nonvolatile memory cell may have a graded source region to reduce the likelihood of a junction breakdown between the graded source region and the substrate, a halo region to increase the electrical field near the drain region to improve programming efficiency, another suitable feature, or any combination thereof.

Those features may cause other consequences, particularly with respect to read operations. The graded source region typically occupies a larger area and results in a higher capacitance between the graded source region and the substrate, as compared to a source region of a logic transistor. The higher capacitance can slow the read operation. The halo region may be more likely to cause a read disturb problem with the nonvolatile memory cell than if a lightly-doped drain or an extension region were used instead of the halo region.

BRIEF DESCRIPTION OF THE DRAWINGS

Embodiments are illustrated by way of example and are not limited in the accompanying figures.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

An electronic device can include a nonvolatile memory cell. A circuit for the nonvolatile memory cell can be designed such that when changing the state of the memory cell (e.g., programming or erasing), an active region of a transistor is used to introduce or remove the charge, and when reading the memory cell, a different active region of a different transistor is used. In this manner, the good programming and erasing performance of the nonvolatile memory cell can be achieved without sacrificing the reading performance of the memory cell. The reading performance can be improved without significantly affecting the programming and erasing performance, and vice versa. In a particular embodiment, gate electrodes of transistors can be made from a single gate electrode layer.

In a particular embodiment, a circuit for a nonvolatile memory cell can include a charge-altering terminal, an output terminal configured to provide a signal corresponding to a state of the memory cell when reading the nonvolatile memory cell, a first transistor including a gate electrode that electrically floats and an active region including a current-carrying electrode, wherein the current-carrying electrode is coupled to the output terminal, and a second transistor including a first electrode and a second electrode, wherein the first electrode is coupled to the gate electrode of the first transistor, and the second electrode is coupled to the charge-altering terminal. The circuit can be designed such that when changing the state of the memory cell, the second transistor would be active and no significant amount of charge carriers would be transferred between the gate electrode of the first transistor and the active region of the first transistor. Other embodiments can include the electronic device itself and a process of forming the electronic device.

After reading this specification, skilled artisans will appreciate that exemplary embodiments are disclosed to illustrate the concepts described herein. Many other circuits, electronic device, and processes can be used without departing the scope of the present invention.

Before addressing details of embodiments described below, some terms are defined or clarified. The term "coupling" is intended to mean transmission of a signal from a conductive member or component to another conductive member or component. Coupling can include capacitive coupling, conductive coupling, inductive coupling, or the like. Conductive coupling can include coupling in which carriers (electrons or holes) can flow between two different conductive members, two different components, or a combination of a conductive member and a component that are electrically connected to each other (i.e., no intervening switch or other component). Alternatively, conductive coupling can also include one or more switches between two different conductive members, two different components, or a combination of a conductive member and a component, such that when the switches are closed (e.g., transistors on), carriers can flow. Capacitive coupling is not conductive coupling because a dielectric layer substantially prevents carriers from flowing under normal operating conductions.

Unless otherwise defined, all technical and scientific terms used herein have the same meaning as commonly understood by one of ordinary skill in the art to which this invention belongs. Other features and advantages of the invention will be apparent from the following detailed description, and from the claims. To the extent not described herein, many details regarding specific materials, processing acts, and circuits are conventional and may be found in textbooks and other sources within the semiconductor and microelectronic arts.

In FIGS. 1 through 10, different circuits can be used for a nonvolatile memory cell. The nonvolatile memory cell can be a standalone memory cell, such as a register, or may be part of a memory array. The nonvolatile memory cell can include transistors that each includes a pair of current-carrying electrodes and a control electrode. For field-effect transistors, the current-carrying electrodes can be source regions, drain regions, source/drain regions, or any combination thereof. As used hereinafter, the term "S/D region" will be used to refer to a current-carrying electrode of a field-effect transistor, regardless whether the current-carrying electrode will only be a source region, only a drain region, or a source region or a drain region (depending on biasing conditions) during normal operation of the circuit. While the figures illustrate particular embodiments, after reading this specification, skilled artisans will appreciate that many other circuits can be designed to achieve the functionality of the nonvolatile memory cell as described herein.

Figure 1:
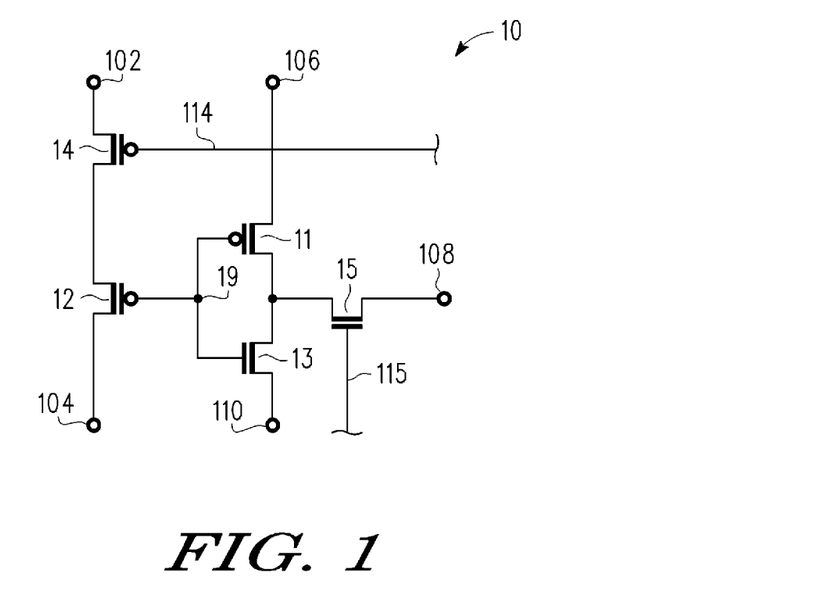
FIG. 1 includes a circuit diagram of a nonvolatile memory cell in which an active region is used when programming or erasing the nonvolatile memory cell and another active region is used when reading the nonvolatile memory cell in accordance with an embodiment.

FIG. 1 includes a circuit diagram of nonvolatile memory cell 10 in accordance with an embodiment. Nonvolatile memory cell 10 includes transistor 11 that has a current-carrying electrode coupled to terminal 106. Nonvolatile memory cell 10 also includes transistor 12 that has a gate electrode coupled to a gate electrode of transistor 11. A current-carrying electrode of transistor 12 is coupled to terminal 104. Nonvolatile memory cell 10 further includes transistor 13 that has a current-carrying electrode coupled to terminal 110, a gate electrode coupled to the gate electrodes of transistors 12 and 11 at floating node 19, and another current-carrying electrode that is coupled to another current-carrying electrode of transistor 11 and output terminal 108. Nonvolatile memory cell 10 still further includes transistor 14 that has a current-carrying electrode coupled to terminal 102 and another current-carrying electrode coupled to another current-carrying electrode of transistor 12. A gate electrode of transistor 14 is coupled to select line 114. Nonvolatile memory cell 10 also includes transistor 15, wherein a current-carrying electrode of transistor 15 is coupled to output terminal 108 and another current-carrying electrode is coupled to the other current-carrying electrodes of transistors 11 and 13. A gate electrode of transistor 15 is coupled to pass line 115. In a particular embodiment, transistors 11, 12, and 14 are p-channel transistors, and transistors 13 and 15 are n-channel transistors.

Nonvolatile memory cell 10 can have the charge at floating node 19 altered by tunneling or hot carrier injection. A charge altering operation can include programming or erasing. When altering a charge at floating node 19, electrons or holes tunnel or are introduced into or are removed from floating node 19 via an active region within transistor 12. Thus, terminal 102, terminal 104, or both are charge-altering terminals, as electrons or holes that affect the charge at floating node 19 may pass through terminal 102, 104, or both. In a particular embodiment, terminals 102 and 104 may be placed at an appropriate potential, and a signal on the select line 114 can turn on transistor 14 to allow current to pass between the terminals 102 and 104. When programming using hot electron injection, terminal 102 can be at a higher potential than terminal 104. Current flows between terminals 102 and 104, and hot electrons can be generated within the channel region of transistor 12 and injected through a gate dielectric layer and into the gate electrode of transistor 12. Alternatively, a substrate or well region in which the channel region of transistor 12 lies can be placed at a significantly high voltage if electrons are to be removed from the gate electrode of transistor 12 or at a significantly low voltage if holes are to be removed from the gate electrode of transistor 12. In this alternative embodiment, Fowler-Nordheim tunneling is used. As illustrated in FIG. 1, the gate electrodes of transistors 11, 12, and 13 are conductively coupled, and more particularly, electrically connected to one another. Thus, when the charge on the gate electrode of transistor 12 is altered, the charges on the gate electrodes of transistors 11 and 13 are likewise altered. When altering the charge of the gate electrode of transistor 12, transistor 15 may be off.

When reading data from nonvolatile memory cell 10, a signal on pass line 115 turns on transistor 15 and allows a signal on the other current-carrying electrodes of transistors 11 and 13 to pass to output terminal 108. In a particular embodiment, terminal 106 can be at a voltage higher than terminal 110. In a more particular embodiment, terminal 106 can be a $V_{DD}$ terminal, and terminal 110 can be a $V_{SS}$ terminal. Thus, the combination of transistors 11 and 13 can operate as an inverter, wherein the voltage at floating node 19 is an input to the inverter, and an output of the inverter is coupled to the transistor 15.

In this particular embodiment, transistors 11 and 13 can be designed for logic digital applications without having to form halo regions, graded junctions, or the like within transistors 11 and 13. Therefore the reading performance of nonvolatile memory cell 10 may be greater than if the halo regions, graded junctions, or other features would be present. Still further, the charge of the floating node is altered by adding or removing carriers via transistor 12. Therefore, transistor 12 can be designed more particularly for programming and erasing, rather than logic applications.

Figure 2:
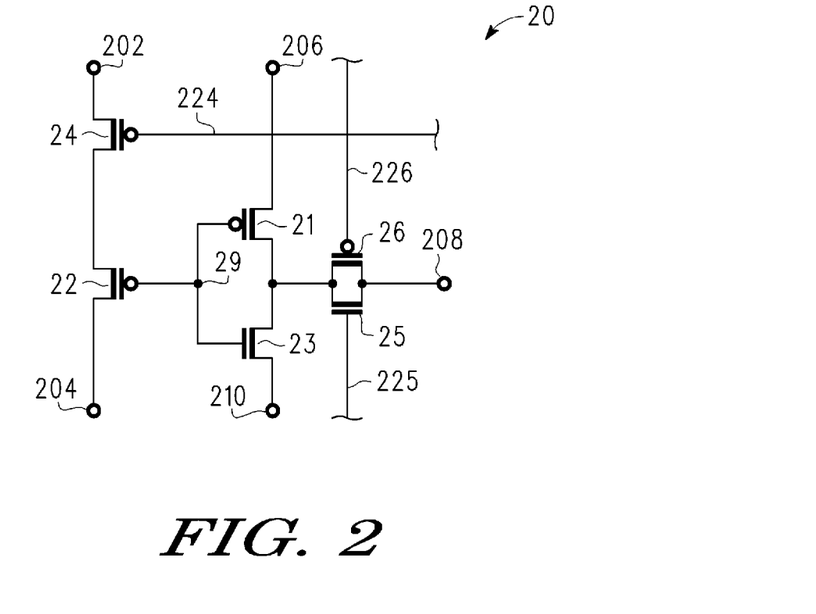
FIGS. 2 to 10 include circuit diagrams of other nonvolatile memory cells in accordance with other embodiments.

FIG. 2 includes another embodiment that is similar to the embodiment of FIG. 1 except that a transmission gate rather than a single pass transistor is used near the output terminal during a read operation. FIG. 2 includes a circuit diagram of nonvolatile memory cell 20 that includes transistor 21 having a current-carrying electrode coupled to terminal 206. Nonvolatile memory cell 20 also includes transistor 22 that has a gate electrode coupled to a gate electrode of transistor 21. A current-carrying electrode of transistor 22 is coupled to terminal 204. Nonvolatile memory cell 20 further includes transistor 23 that has a current-carrying electrode coupled to terminal 210, a gate electrode coupled to the gate electrodes of transistors 22 and 21 at floating node 29, and another current-carrying electrode that is coupled to another current-carrying electrode of transistor 21 and output terminal 208. Nonvolatile memory cell 20 still further includes transistor 24 that has a current-carrying electrode coupled to terminal 202 and another current-carrying electrode coupled to another current-carrying electrode of transistor 22. A gate electrode of transistor 24 is coupled to select line 224. Nonvolatile memory cell 20 also includes transistors 25 and 26, wherein current-carrying electrodes of transistors 25 and 26 are coupled to output terminal 208 and other current-carrying electrodes of transistors 25 and 26 are coupled to the other current-carrying electrodes of the transistors 21 and 23. A gate electrode of transistor 25 is coupled to pass line 225, and a gate electrode of transistor 26 is coupled to another pass line 226. In a particular embodiment, transistors 21, 22, 24, and 26 are p-channel transistors, and transistors 23 and 25 are n-channel transistors.

The embodiment as illustrated in FIG. 2 can have the charge at the floating node altered using any one or more of the embodiments as described within FIG. 1. Terminals 202 and 204, transistors 22 and 24, and select line 224 in FIG. 2 are used similar to terminals 102 and 104, transistors 12 and 14, and select line 114 in FIG. 1.

The combination of transistors 25 and 26 can be implemented as a transmission gate. The transmission gate may be more efficient at transmitting a signal at the other current-carrying electrodes of transistors 21 and 23 to output terminal 208, regardless of the state of that particular signal. Signals on pass lines 225 and 226 can be opposite of each other during normal operation. Thus, if a signal on pass line 225 is logic high, a signal on pass line 226 is logic low, and vice versa. When reading data from the nonvolatile memory cell 20, a signal on pass lines 225 and 226 turns on the transistors 25 and 26 and allows a signal on the other current-carrying electrodes of transistors 21 and 23 to pass to the output terminal 208. In a particular embodiment, terminal 206 can be at a voltage higher than terminal 210. In a more particular embodiment, terminal 206 can be a $V_{DD}$ terminal, and the terminal 210 can be a $V_{SS}$ terminal. Thus, the combination of transistors 21 and 23 can operate as an inverter, wherein the voltage at floating node 29 is an input to the inverter, and an output of the inverter is received by transistors 25 and 26.

Figure 3:
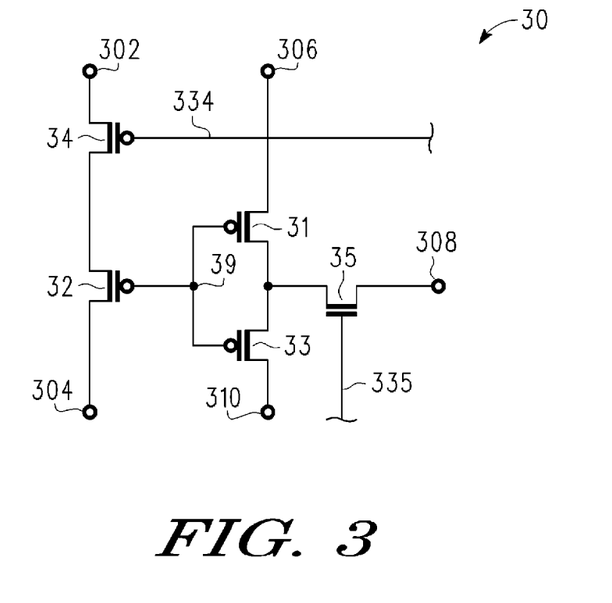

FIG. 3 includes another embodiment that is similar to the embodiment of FIG. 1 except that an n-channel transistor is replaced by a p-channel transistor. FIG. 3 includes a circuit diagram of nonvolatile memory cell 30 that includes transistor 31 that has a current-carrying electrode coupled to terminal 306. Nonvolatile memory cell 30 also includes transistor 32 that has a gate electrode coupled to a gate electrode of transistor 31. A current-carrying electrode of transistor 32 is coupled to terminal 304. Nonvolatile memory cell 30 further includes transistor 33 that has a current-carrying electrode coupled to terminal 310, a gate electrode coupled to the gate electrodes of transistors 32 and 31 at floating node 39, and another current-carrying electrode that is coupled to another current-carrying electrode of transistor 31 and output terminal 308. Nonvolatile memory cell 30 still further includes transistor 34 that has a current-carrying electrode coupled to terminal 302 and another current-carrying electrode coupled to another current-carrying electrode of transistor 32. A gate electrode of the transistor 34 is coupled to select line 334. Nonvolatile memory cell 30 also includes transistor 35, wherein a current-carrying electrode of transistor 35 is coupled to output terminal 308 and another current-carrying electrode is coupled to the other current-carrying electrodes of transistors 31 and 33. A gate electrode of transistor 35 is coupled to pass line 335. In a particular embodiment, transistors 31, 32, 33, and 34 are p-channel transistors, and transistor 35 is an n-channel transistor.

Unlike FIG. 1 in which transistor 11 is a p-channel transistor and transistor 13 is an n-channel transistor, transistors 31 and 33 are p-channel transistors. The gate dielectric layer, channel doping, Fermi Level, another transistor characteristic, or any combination thereof can be different between the transistors 31 and 33, such that one but not both of transistors are on when reading nonvolatile memory cell 30 when in a particular state. For example, the gate dielectric layers may have different thicknesses, compositions, or both. The channel region of transistor 31 may have a different doping concentration as compared to the channel region of transistor 33. The Fermi level of the gate electrode of transistor 31 may be closer to the valence band, and the Fermi level of the gate electrode of transistor 33 may be closer to the conduction band. After reading this specification, skilled artisans will be able to determine the transistor characteristics of transistors 31 and 33 to achieve the desired operation.

Programming, erasing, and reading of nonvolatile memory cell 30 can be performed using any of the embodiments as previously described with respect to FIG. 1. Terminals 302 304, 306, 308, and 310, transistors 31 to 35, pass line 335, and select line 334 in FIG. 3 are used similar to terminals 102, 104, 106, 108, and 110, transistors 11 to 15, pass line 115, and select line 114 in FIG. 1.

Figure 4:
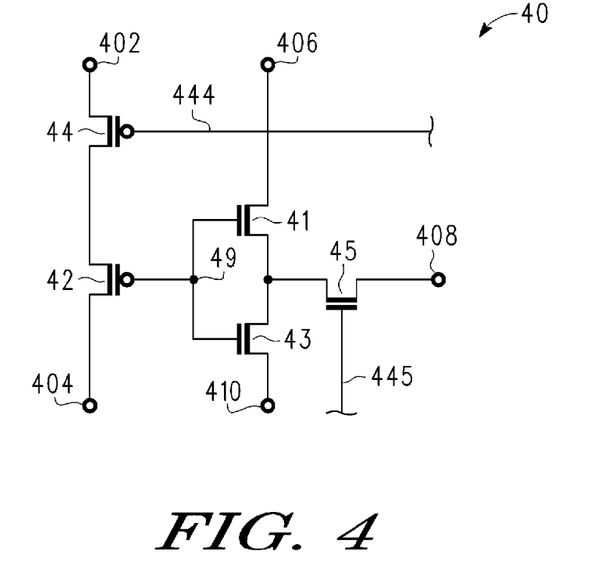

FIG. 4 includes another embodiment that is similar to the embodiment of FIG. 1 except that a p-channel transistor is replaced by an n-channel transistor. FIG. 4 includes a circuit diagram of nonvolatile memory cell 40 that includes transistor 41 that has a current-carrying electrode coupled to terminal 406. Nonvolatile memory cell 40 also includes transistor 42 that has a gate electrode coupled to a gate electrode of transistor 41. A current-carrying electrode of transistor 42 is coupled to terminal 404. Nonvolatile memory cell 40 further includes transistor 43 that has a current-carrying electrode coupled to terminal 410, a gate electrode coupled to the gate electrodes of transistors 42 and 41 at floating node 49, and another current-carrying electrode that is coupled to another current-carrying electrode of transistor 41 and output terminal 408. Nonvolatile memory cell 40 still further includes transistor 44 that has a current-carrying electrode coupled to terminal 402 and another current-carrying electrode coupled to another current-carrying electrode of transistor 42. A gate electrode of transistor 44 is coupled to select line 444. The nonvolatile memory cell 40 also includes transistor 45, wherein a current-carrying electrode of transistor 45 is coupled to output terminal 408 and another current-carrying electrode is coupled to the other current-carrying electrodes of transistors 41 and 43. A gate electrode of transistor 45 is coupled to pass line 445. In a particular embodiment, transistors 42 and 44 are p-channel transistors, and transistors 41, 43, and 45 are n-channel transistors.

Unlike FIG. 1 in which transistor 11 is a p-channel transistor and transistor 13 is an n-channel transistor, transistors 41 and 43 are n-channel transistors. The gate dielectric layer, channel doping, Fermi Level, another transistor characteristic, or any combination thereof can be different between transistors 41 and 43, such that one but not both of the transistors are on when reading nonvolatile memory cell 40 when in a particular state. For example, the gate dielectric layers may have different thicknesses, compositions, or both. The channel region of transistor 41 may have a different doping concentration as compared to the channel region of transistor 43. The Fermi level of the gate electrode of transistor 41 may be closer to the valence band, and the Fermi level of the gate electrode of transistor 43 may be closer to the conduction band. After reading this specification, skilled artisans will be able to determine the transistor characteristics of transistors 41 and 43 to achieve the desired operation.

Programming, erasing, and reading of nonvolatile memory cell 40 can be performed using any of the embodiments as previously described with respect to FIG. 1. Terminals 402 404, 406, 408, and 410, transistors 41 to 45, pass line 445, and select line 444 in FIG. 4 are used similar to terminals 102, 104, 106, 108, and 110, transistors 11 to 15, pass line 115, and select line 114 in FIG. 1.

Figure 5:
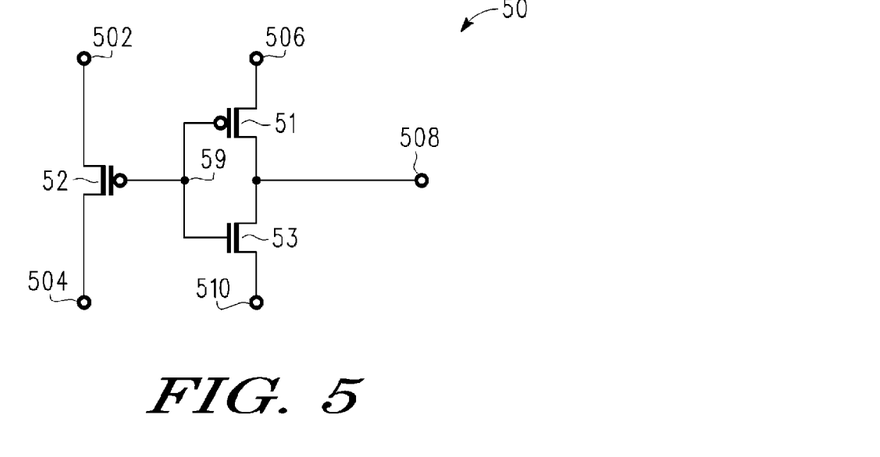

FIG. 5 includes another embodiment that is similar to the embodiment of FIG. 1 except that no select transistor or pass transistor is used. The embodiment, as illustrated in FIG. 5 may be useful for a standalone bit that is not part of a memory array. FIG. 5 includes a circuit diagram of nonvolatile memory cell 50 that includes transistor 51 that has a current-carrying electrode coupled to terminal 506. Nonvolatile memory cell 50 also includes transistor 52 that has a gate electrode coupled to a gate electrode of transistor 51. A current-carrying electrode of transistor 52 is coupled to terminal 504, and another current carrying electrode is coupled to terminal 502. Nonvolatile memory cell 50 further includes a transistor 53 that has a current-carrying electrode coupled to terminal 510, a gate electrode coupled to the gate electrodes of transistors 52 and 51 at floating node 59, and another current-carrying electrode that is coupled to another current-carrying electrode of transistor 51 and output terminal 508. In a particular embodiment, transistors 51 and 52 are p-channel transistors, and transistor 53 is an n-channel transistor.

Nonvolatile memory cell 50 can have the charge of floating node 59 altered by tunneling or hot carrier injection. When altering a charge at floating node 59, electrons or holes tunnel or are introduced into or are removed from floating node 59 via an active region within transistor 52. Thus, terminal 502, terminal 504, or both are charge-altering terminals, as electrons or holes that affect the charge of floating node 59 may pass through either or both of terminals 502 or 504. In a particular embodiment, the terminals 502 and 504 may be placed at an appropriate potential to allow current to pass between the terminals 502 and 504. When programming using hot electron injection, terminal 502 can be at a higher potential than terminal 504 or vice versa. Hot electrons can be injected through a gate dielectric layer and into the gate electrode of transistor 52. In the embodiment as illustrated in FIG. 5, the gate electrodes of transistors 51, 52, and 53 are conductively coupled, and more particularly, electrically connected to one another. Thus, when the charge on the gate electrode of transistor 52 is altered, the charges on the gate electrodes of transistors 51 and 53 are likewise altered.

When reading data from the nonvolatile memory cell 50, a signal on the other current-carrying electrodes of transistors 51 and 53 pass to the output terminal 508. In a particular embodiment, terminal 506 can be at a voltage higher than terminal 510. In a more particular embodiment, terminal 506 can be a $V_{DD}$ terminal, and the terminal 510 can be a $V_{SS}$ terminal. Thus, the combination of transistors 51 and 53 can operate as an inverter, wherein the voltage at floating node 59 is an input to the inverter, and an output of the inverter is received by the terminal 508.

Figure 6:
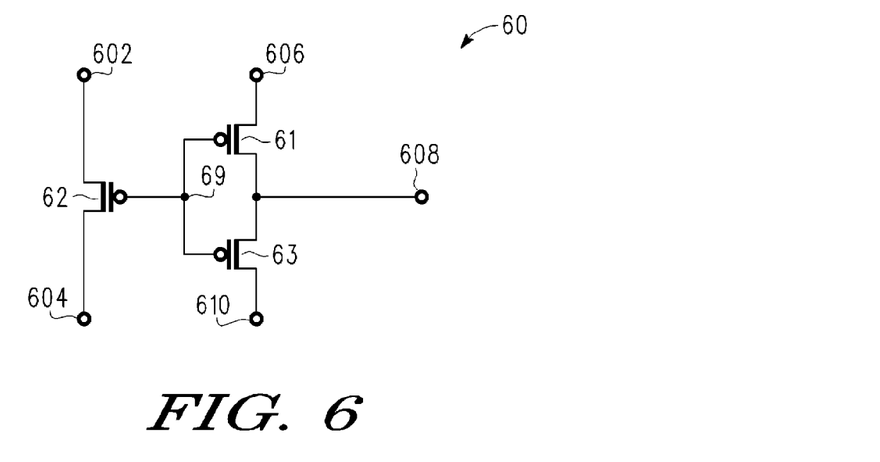

FIG. 6 includes another embodiment that is similar to the embodiment of FIG. 5 except that an n-channel transistor is replaced by a p-channel transistor. FIG. 6 includes a circuit diagram of nonvolatile memory cell 60 that includes transistor 61 that has a current-carrying electrode coupled to terminal 606. Nonvolatile memory cell 60 also includes transistor 62 that has a gate electrode coupled to a gate electrode of transistor 61. A current-carrying electrode of transistor 62 is coupled to nonvolatile memory cell 60 further includes transistor 63 that has a current-carrying electrode coupled to terminal 610, a gate electrode coupled to the gate electrodes of transistors 62 and 61 at floating node 69, and another current-carrying electrode that is coupled to another current-carrying electrode of transistor 61 and output terminal 608. In a particular embodiment, transistors 61, 62, and 63 are p-channel transistors.

Unlike FIG. 5 in which transistor 51 is a p-channel transistor and transistor 53 is an n-channel transistor, transistors 61 and 63 are p-channel transistors. The gate dielectric layer, channel doping, Fermi Level, another transistor characteristic, or any combination thereof can be different between the transistors 61 and 63, such that one but not both of transistors are on when reading nonvolatile memory cell 60 when in a particular state. For example, the gate dielectric layers may have different thicknesses, compositions, or both. The channel region of transistor 61 may have a different doping concentration as compared to the channel region of transistor 63. The Fermi level of the gate electrode of transistor 61 may be closer to the valence band, and the Fermi level of the gate electrode of transistor 63 may be closer to the conduction band. After reading this specification, skilled artisans will be able to determine the transistor characteristics of transistors 61 and 63 to achieve the desired operation.

Programming, erasing, and reading of nonvolatile memory cell 60 can be performed using any of the embodiments as previously described with respect to FIG. 5. Terminals 602 604, 606, 608, and 610 and transistors 61 to 63 in FIG. 6 are used similar to terminals 502, 504, 506, 508, and 510 and transistors 51 to 53 in FIG. 5.

Figure 7:
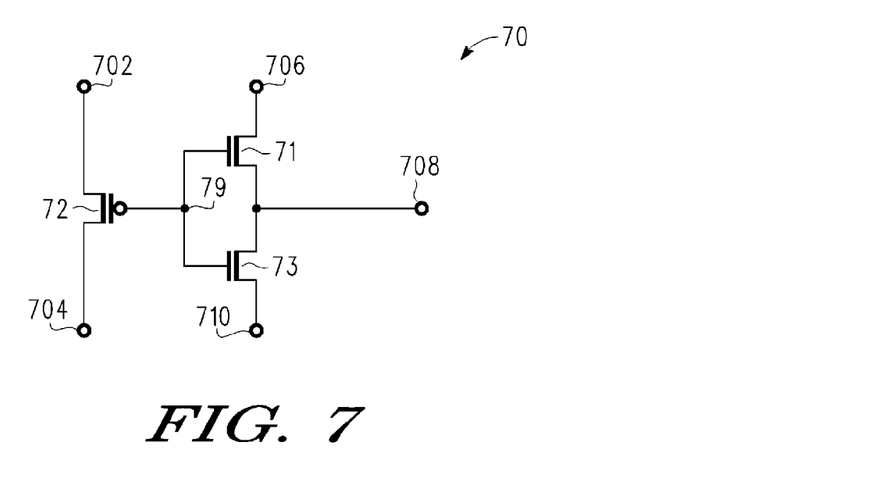

FIG. 7 includes another embodiment that is similar to the embodiment of FIG. 5 except that a p-channel transistor is replaced by an n-channel transistor. FIG. 7 includes a circuit diagram of nonvolatile memory cell 70 that includes transistor 71 that has a current-carrying electrode coupled to terminal 706. Nonvolatile memory cell 70 also includes transistor 72 that has a gate electrode coupled to a gate electrode of transistor 71. A current-carrying electrode of transistor 72 is coupled to terminal 704, and another current-carrying electrode of transistor 72 is coupled to terminal 702. Nonvolatile memory cell 70 further includes transistor 73 that has a current-carrying electrode coupled to terminal 710, a gate electrode coupled to the gate electrodes of transistors 72 and 71 at floating node 79, and another current-carrying electrode that is coupled to another current-carrying electrode of transistor 71 and output terminal 708. In a particular embodiment, transistors 71 and 73 are n-channel transistors, and transistor 72 is a p-channel transistor.

Unlike FIG. 5 in which transistor 51 is a p-channel transistor and transistor 53 is an n-channel transistor, transistors 71 and 73 are n-channel transistors. The gate dielectric layer, channel doping, Fermi Level, another transistor characteristic, or any combination thereof can be different between transistors 71 and 73, such that one, but not both of transistors 71 and 73, is on when reading nonvolatile memory cell 70 when in a particular state. For example, the gate dielectric layers may have different thicknesses, compositions, or both. The channel region of transistor 71 may have a different doping concentration as compared to the channel region of transistor 73. The Fermi level of the gate electrode of transistor 71 may be closer to the valence band, and the Fermi level of the gate electrode of transistor 73 may be closer to the conduction band. After reading this specification, skilled artisans will be able to determine the transistor characteristics of transistors 71 and 73 to achieve the desired operation.

Programming, erasing, and reading of nonvolatile memory cell 70 can be performed using any of the embodiments as previously described with respect to FIG. 5. Terminals 702 704, 706, 708, and 710 and transistors 71 to 73 in FIG. 7 are used similar to terminals 502, 504, 506, 508, and 510 and transistors 51 to 53 in FIG. 5.

Figure 8:
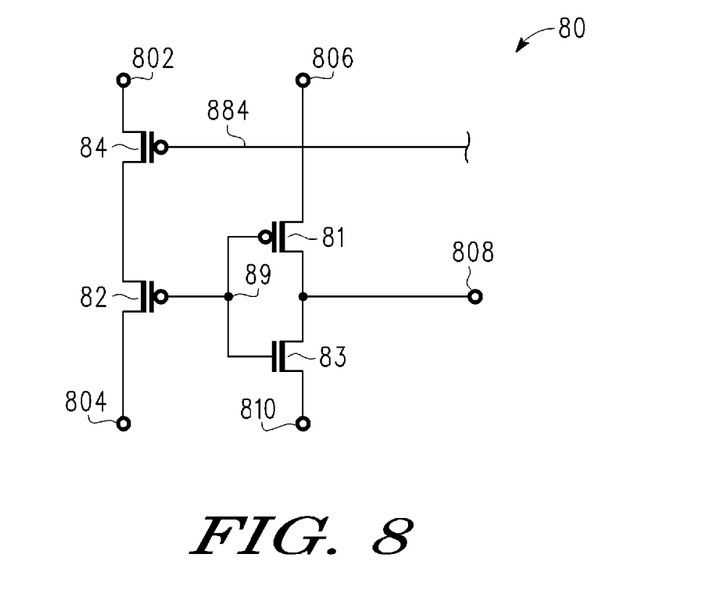

FIG. 8 includes another embodiment that is similar to the embodiment of FIG. 1 except that no pass transistor is used. FIG. 8 includes a circuit diagram of nonvolatile memory cell 80 that includes transistor 81 having a current-carrying electrode coupled to terminal 806. Nonvolatile memory cell 80 also includes transistor 82 that has a gate electrode coupled to a gate electrode of transistor 81. A current-carrying electrode of the transistor 82 is coupled to terminal 804. Nonvolatile memory cell 80 further includes transistor 83 that has a current-carrying electrode coupled to terminal 810, a gate electrode coupled to the gate electrodes of transistors 82 and 81 at floating node 89, and another current-carrying electrode that is coupled to another current-carrying electrode of transistor 81 and output terminal 808. Nonvolatile memory cell 80 still further includes transistor 84 that has a current-carrying electrode coupled to terminal 802 and another current-carrying electrode coupled to another current-carrying electrode of transistor 82. A gate electrode of transistor 84 is coupled to select line 884. In a particular embodiment, transistors 81, 82, and 84 are p-channel transistors, and transistor 83 is an n-channel transistor.

Programming, erasing, and reading of nonvolatile memory cell 80 can be performed using any of the embodiments as previously described with respect to FIG. 1. Terminals 802, 804, 806, 808, and 810, transistors 81 to 84, and select line 884 in FIG. 8 are used similar to terminals 102, 104, 106, 108, and 110, transistors 11 to 14, and select line 114 in FIG. 1.

When reading data from the nonvolatile memory cell 80, a signal on the other current-carrying electrodes of transistors 81 and 83 is provided to the output terminal 808. In a particular embodiment, terminal 806 can be at a voltage higher than terminal 810. In a more particular embodiment, terminal 806 can be a $V_{DD}$ terminal, and the terminal 810 can be a $V_{SS}$ terminal. Thus, the combination of transistors 81 and 83 can operate as an inverter, wherein the voltage at floating node 89 is an input to the inverter, and an output of the inverter is coupled to the output terminal 808.

Figure 9:
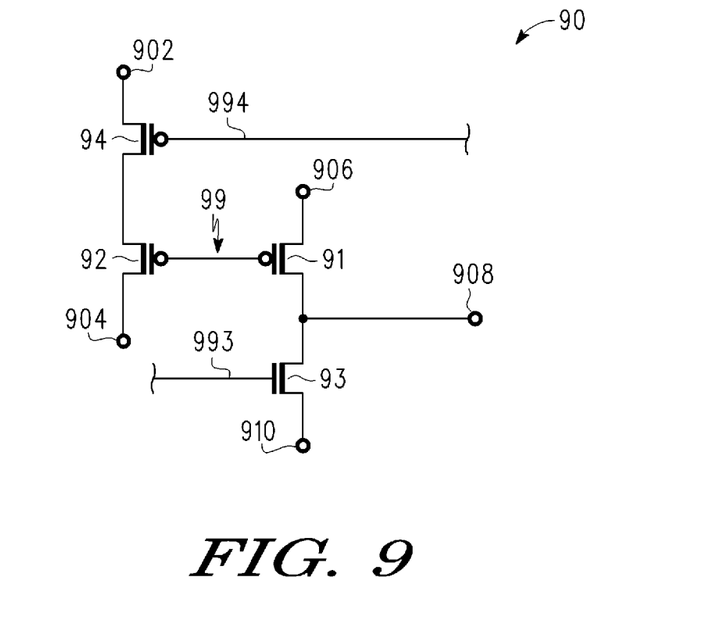

FIG. 9 includes another embodiment that is similar to the embodiment of FIG. 1 except that no pass transistor is used, and an n-channel transistor is configured as a pull-down transistor. FIG. 9 includes a circuit diagram of nonvolatile memory cell 90 that includes transistor 91 having a current-carrying electrode coupled to terminal 906. Nonvolatile memory cell 90 also includes transistor 92 that has a gate electrode coupled to a gate electrode of transistor 91 at floating node 99. A current-carrying electrode of transistor 92 is coupled to terminal 904. Nonvolatile memory cell 90 further includes transistor 93 that has a current-carrying electrode coupled to terminal 910, a gate electrode that turns transistor 93 on and off, and another current-carrying electrode that is coupled to another current-carrying electrode of transistor 91 and output terminal 908. Nonvolatile memory cell 90 still further includes transistor 94 that has a current-carrying electrode coupled to terminal 902 and another current-carrying electrode coupled to another current-carrying electrode of transistor 92. A gate electrode of transistor 94 is coupled to select line 994. In a particular embodiment, transistors 91, 92, and 94 are p-channel transistors, and transistor 93 is an n-channel transistors.

Transistor 93 can be designed such that it is a significantly stronger as compared to transistor 91. For example, the transconductance of transistor 93 can be significantly higher as compared to transistor 91. The transconductance of a transistor can be affected by the gate dielectric thickness or composition, channel doping, channel width, channel length, or any combination thereof. In such a design, the voltage on terminal 908 will be substantially the same as the voltage on the terminal 910 when a signal on pull-down line 993 turns on transistor 93, regardless of the voltage at floating node 99. When terminal 910 is a $V_{SS}$ terminal, terminal 908 will be substantially at $V_{SS}$ when transistor 93 is on. If data from nonvolatile memory cell 90 is to be read, pull-down line 993 is disabled or deactivated, and transistor 93 is turned off. Depending on the voltage at floating node 99, the voltage on terminal 908 will become substantially the same as terminal 906 if the transistor 91 is on, or the voltage on terminal 908 will be closer to the voltage on terminal 910 than the voltage on terminal 906.

Programming and erasing can be performed using any of the embodiments as described with respect to the embodiments of FIG. 1. Terminals 902 and 904, transistors 92 and 94, and select line 994 in FIG. 9 are used similar to terminals 102 and 104, transistors 12 and 14, and select line 114 in FIG. 1.

Figure 10:
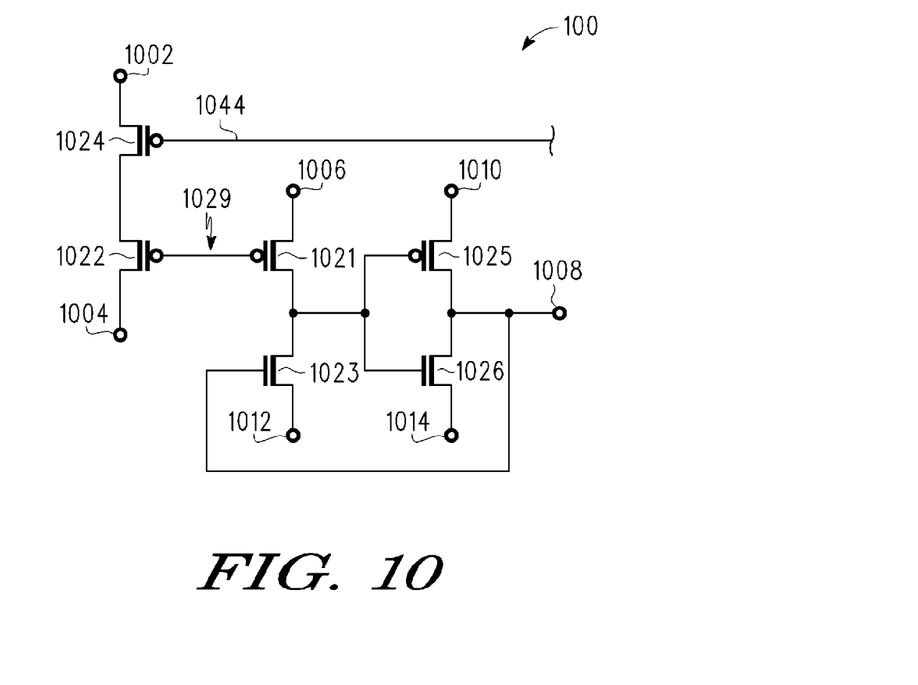

FIG. 10 includes an embodiment that is a static version of the embodiment as illustrated in FIG. 9. The embodiment as illustrated in FIG. 10 includes a floating node and a combination of transistors that act as a latch. FIG. 10 includes a circuit diagram of nonvolatile memory cell 100 that includes transistor 1021 that has a current-carrying electrode coupled to terminal 1006. Nonvolatile memory cell 100 also includes transistor 1022 that has a gate electrode coupled to a gate electrode of transistor 1021 at floating node 1029. A current-carrying electrode of transistor 1022 is coupled to terminal 1004. Nonvolatile memory cell 100 further includes transistor 1024 that has a current-carrying electrode coupled to terminal 1002 and another current-carrying electrode coupled to another current-carrying electrode of transistor 1022. A gate electrode of transistor 1024 is coupled to select line 1044. Nonvolatile memory cell 100 still further includes transistor 1023 that has a current-carrying electrode coupled to terminal 1012, and another current-carrying electrode that is coupled to another current-carrying electrode of transistor 1021. Nonvolatile memory cell 100 also includes a transistor 1025, wherein a current-carrying electrode of transistor 1025 is coupled to terminal 1010, and a gate electrode is coupled to the other current-carrying electrodes of the transistors 1021 and 1023. Nonvolatile memory cell 100 further includes transistor 1026, wherein a current-carrying electrode of transistor 1026 is coupled to terminal 1014, and a gate electrode is coupled to the other current-carrying electrodes of transistors 1021 and 1023 and the gate electrode of transistor 1025. Other current-carrying electrodes of transistor 1025 and 1026 are coupled to a gate electrode of transistor 1023 and output terminal 1008. In a particular embodiment, transistors 1021, 1022, 1024, and 1025 are p-channel transistors, and transistors 1023 and 1026 are n-channel transistors.

Transistors 1023, 1025, and 1026 act as a latch. In a particular embodiment, terminals 1006 and 1010 can be at $V_{DD}$, and terminals 1012 and 1014 can be at $V_{SS}$. When the voltage on floating node 1029 is logic low, transistor 1021 is on and causes the gate electrodes of transistors 1025 and 1026 to be substantially at $V_{DD}$. The combination of transistors 1025 and 1026 act as an inverter and causes the voltage at output terminal 1008 to be substantially at $V_{SS}$. When the gate electrode of transistor 1023 is substantially at $V_{SS}$, transistor 1023 is off. Alternatively, when the voltage on floating node 1029 is logic high, transistor 1021 is off. The gate electrodes of transistors 1025 and 1026 will be substantially at $V_{SS}$. The combination of transistors 1025 and 1026 act as an inverter and causes the voltage at output terminal 1008 to be substantially at $V_{DD}$. When the gate electrode of transistor 1023 is substantially at $V_{DD}$, transistor 1023 is on.

Programming and erasing can be performed using any of the embodiments as described with respect to FIG. 1. Terminals 1002 and 1004, transistors 1022 and 1024, and select line 1044 in FIG. 10 are used similar to terminals 102 and 104, transistors 12 and 14, and select line 114 in FIG. 1

When reading data from the nonvolatile memory cell 100, the output terminal 1008 can be accessed by a component (not illustrated). In another embodiment (not illustrated), a pass transistor or a transmission gate may be used between the output terminal 1008 and the other current carrying electrodes of transistors 1025 and 1026.

While many different circuits have been described, after reading this specification, skilled artisans will appreciate that many other circuits are possible. The use of a select transistor, pass transistor, transmission gate, or any combination thereof can be determined based on the needs or desires for a particular application. Still further, the memory cells may include more or fewer components. For example, referring to FIG. 1, select transistor 14 may be placed between the terminal 104 and transistor 12 if so desired, or another select transistor (not illustrated) may be used between the terminal 104 and transistor 12 to better isolate transistor 12 from program or erase disturb problems. After reading this specification, skilled artisans will appreciate the flexibility in how to implement the nonvolatile memory cell using any one or more of FIGS. 1 to 10 for their particular applications.

The nonvolatile memory cells as illustrated in FIGS. 1 to 10 can be used in a process flow in which a single conductive layer can be used to form gate electrodes for all of the transistors. Such a process is typically referred to as a "single poly" process because a single layer of polycrystalline silicon can be used to form all of the gates. A single poly process typically has less processing operations and simplifies the process flow when making nonvolatile memory cells, particularly in applications where much of an electronic device is used for purposes other than solely as a standalone memory chip. Such applications can include microprocessors, microcontrollers, digital signal processors, application-specific integrated circuits, or the like.

FIGS. 11 to 17 include illustrations of an electronic device when forming nonvolatile memory cell 20. The embodiments described with respect to FIGS. 11 to 17 include some exemplary embodiments that can be used. After reading this specification, skilled artisans will appreciate that other embodiments can be used and may be tailored to the needs or desires to achieve a particular application. Some of the focus of FIGS. 11 to 17 is related to how the processing operations and resulting structures corresponds to the nonvolatile memory cells in the circuits previously described. Thus, many steps in the formation process are not described with respect to FIGS. 11 to 17. After reading this specification, skilled artisans will understand what processing operations would be performed in order to generate a complete process flow for making an electronic device including a nonvolatile memory cell.

Figure 11:
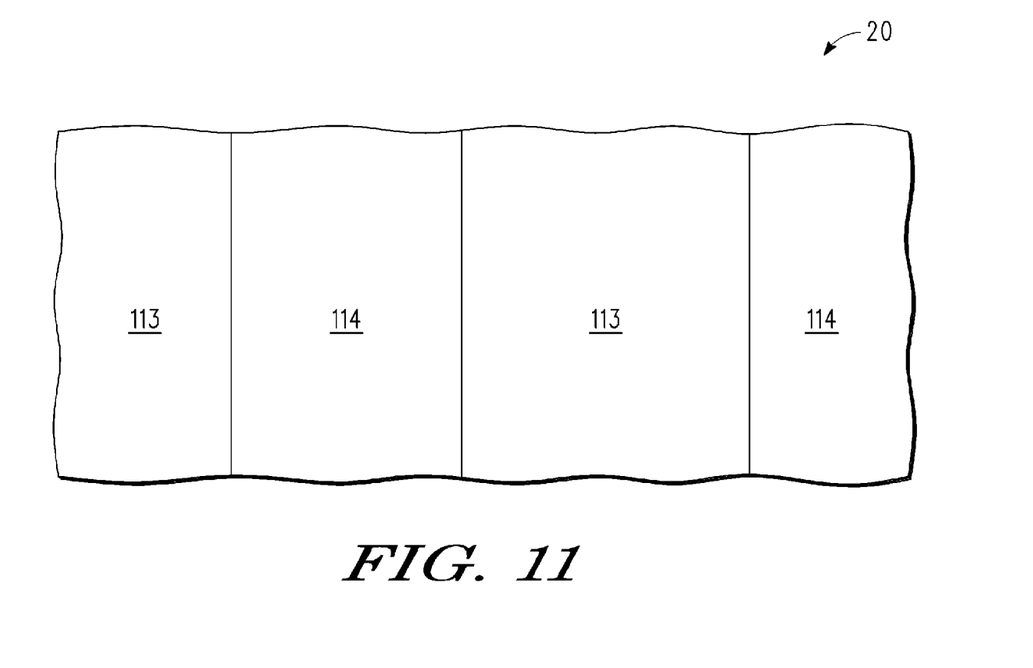
FIG. 11 includes an illustration of a top view of a portion of a workpiece after forming well regions.

FIG. 11 includes an illustration of a top view of a workpiece after forming n-well regions 113 and p-well regions 114. N-well regions 113 and p-well regions 114 can be formed within a substrate, such as a monocrystalline semiconductor wafer, a semiconductor-on-insulator wafer, a flat panel display (e.g., a silicon layer over a glass plate), or other substrate conventionally used to form electronic devices. In one embodiment, dopant concentrations of n-well regions 113 and p-well regions 114 can be formed using a conventional or proprietary dopant, doping concentration, and selective doping techniques.

Figure 12:
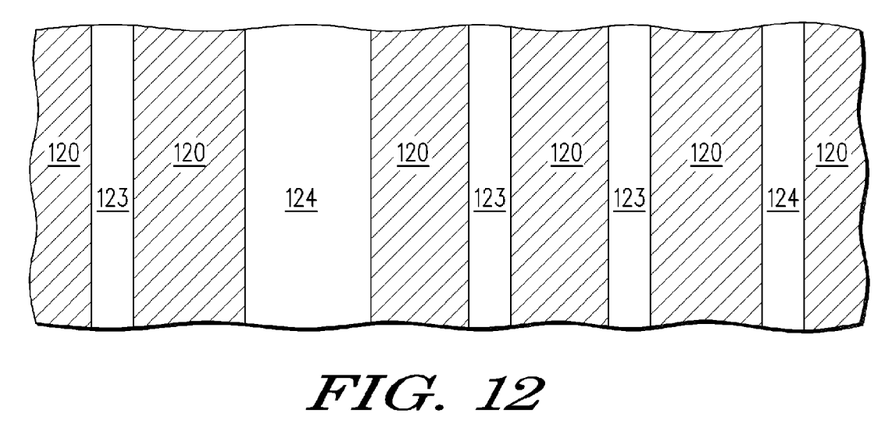
FIG. 12 includes an illustration of a top view of the workpiece of FIG. 11 after forming field isolation regions.

FIG. 12 includes an illustration of a top view of the workpiece after forming field isolation regions 120 that define n-type active regions 123 and p-type active regions 124. N-type active regions 123 and p-type active regions 124 include portions of n-well regions 113 and p-well regions 114, respectively, lying between field isolation regions 120. Field isolation regions 120 may be formed such that field isolation regions 120 are deeper within n-well regions 113 and p-well regions 114 than subsequently formed source/drain regions will be within the n-type active regions 123 and p-type active regions 124. Field isolation regions 120 can be formed using shallow trench isolation, local oxidation of silicon, or another conventional or proprietary process.

Figure 13:
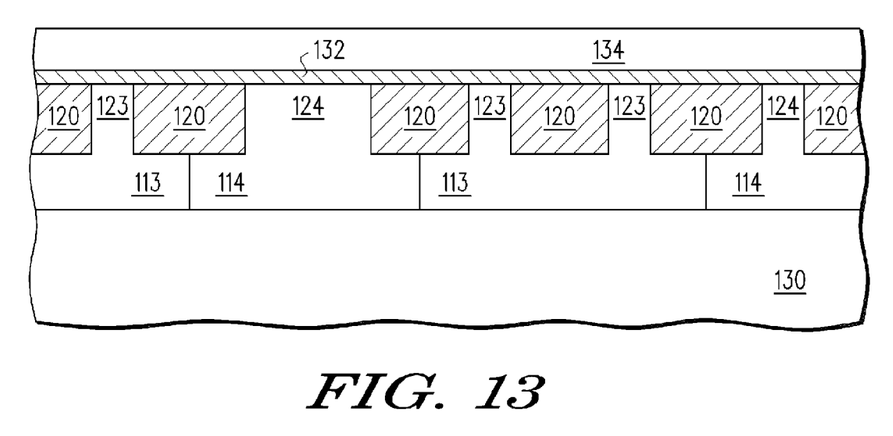
FIG. 13 includes an illustration of a cross-sectional view of the workpiece of FIG. 12 after forming gate dielectric and electrode layers.

FIG. 13 includes an illustration of a cross-sectional view of the workpiece after forming gate dielectric layer 132 and gate electrode layer 134 over field isolation regions 120, n-type active regions 123, and p-type active regions 124. Gate dielectric layer 132 can include a conventional or proprietary gate dielectric material. In the embodiment as illustrated, gate dielectric layer 132 can be deposited, and in another embodiment (not illustrated), gate dielectric layer 132 can be thermally grown from semiconductor material within n-type active regions 123 and p-type active regions 124. In another embodiment (not illustrated) different gate dielectric layers having different compositions, thicknesses, or any combination thereof may be used for different transistors structures within the nonvolatile memory cell being fabricated.

Gate electrode layer 134 can include one or more films. In an embodiment, gate electrode layer 134 can include an amorphous or polycrystalline silicon material, and be doped or undoped, as deposited. Alternatively, gate electrode layer 134 can include a film having a Fermi Level closer to the conduction band overlying n-type active regions 123 and a different film having a different Fermi Level close to the valance band overlying p-type active regions 124. In a particular embodiment, a semiconductor or other film may be used to strap gate electrode layer 134 together such that it conducts and does not form a junction diode. In still another embodiment, gate electrode layer 134 can include an anti-reflective film to reduce reflections when patterning a subsequently-formed mask layer (not illustrated) over gate electrode layer 134. After reading this specification, skilled artisans will be able to determine a composition and deposition sequence in forming gate electrode layer 134 in accordance with conventional or proprietary techniques.

Figure 14:
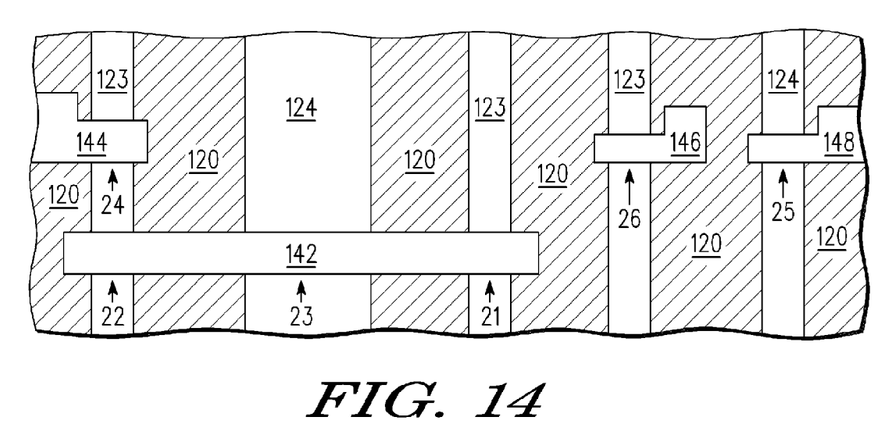
FIG. 14 includes an illustration of a top view of the workpiece of FIG. 13 after forming gate electrodes.

FIG. 14 includes an illustration of a top view of the workpiece after patterning gate electrode layer 134 to form gate electrodes 142, 144, 146, and 148. FIG. 14 also indicates where gate electrodes for transistors 21 to 26 in FIG. 2 can be found in the layout. Gate electrode 142 is allowed to electrically float and covers portions of the n-type active areas 123 and p-type active area 124. Thus, gate electrode 142 includes the floating node 29 as illustrated in FIG. 2. Note that charge is introduced into and removed from gate electrode 142 via n-type active region 123 that lies furthest to the left as illustrated in FIG. 14. Gate electrode 144 can act as a select gate that is used for altering the charge within gate electrode 142. Gate electrode 144 can be subsequently connected to a select line. Gate electrodes 146 and 148 can act as pass gates for pass transistors 26 and 25, respectively. Gate electrodes 146 and 148 can be subsequently connected to different pass lines. The patterning of gate electrode layer 134 to form gate electrodes 142, 144, 146, and 148 can be performed using a conventional or proprietary mask and etch sequence.

Although not illustrated, lightly-doped drains, extension regions or the like, and sidewall spacers can be formed if needed or desired. Additionally, n-type active region 123 near transistor 22 may receive a halo implant or have a graded junction formed to help improve programming characteristics, erasing characteristics, or both. Such features are not required for transistors 21, 23, 25, and 26. Thus, transistors 21, 23, 25, and 26 can be tailored more for digital logic operations, rather than programming and erasing.

Figure 15:
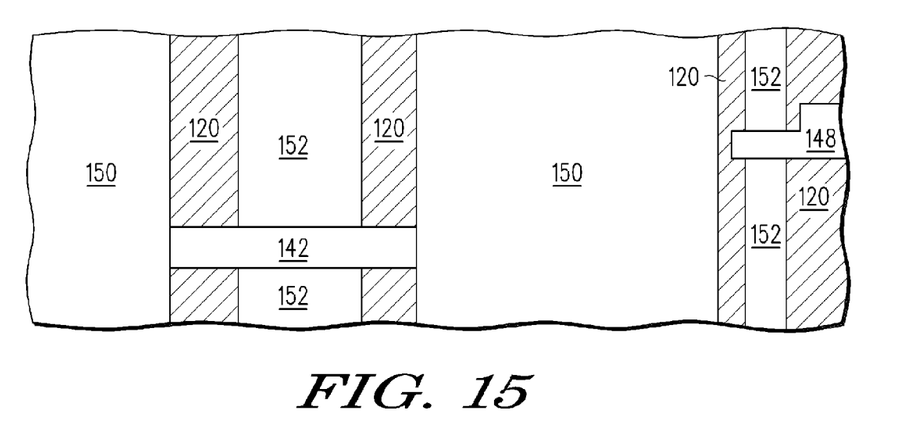
FIG. 15 includes an illustration of a top view of the workpiece of FIG. 14 after forming N+ source/drain regions.

FIG. 15 includes an illustration of a top view of the workpiece after forming masking members 150 and N⁺ S/D regions 152. Masking members 150 cover portions of the workpiece that are not to receive an n-type dopant from an N⁺ S/D doping operation. The N⁺ S/D doping operation can be performed using ion implantation to form N⁺ S/D regions 152 within the p-type active regions 124 (not illustrated in FIG. 15). Exposed portions of gate electrodes 142 and 148 may also be doped when forming the N⁺ S/D regions 152. Masking members 150 are removed after the doping operation is performed. An anneal may or may not be performed to active or diffuse the n-type dopant.

Figure 16:
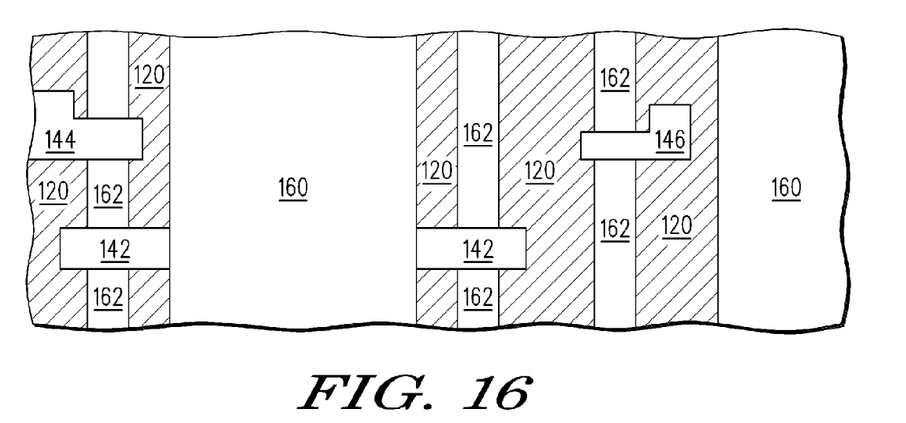
FIG. 16 includes an illustration of a top view of the workpiece of FIG. 15 after forming P+ source/drain regions.

FIG. 16 includes an illustration of a top view of the workpiece after forming masking members 160 and P⁺ S/D regions 162. Masking members 160 cover portions of the workpiece that are not to receive a p-type dopant from a P+ S/D doping operation. The P+ S/D doping operation can be performed using ion implantation to form P+ S/D regions 162 within the n-type active regions 123 (not illustrated in FIG. 16). Exposed portions of gate electrodes 142, 144, and 146 may also be doped when forming the P+S/D regions 162. Masking members 160 are removed after the doping operation is performed. An anneal may be performed to activate the dopant. N+ S/D regions and P+ S/D regions can have a dopant concentration of at least $1 \times 10^{19}$ atoms/cm$^3$ so that ohmic contacts can be subsequently formed to those regions.

Figure 17:
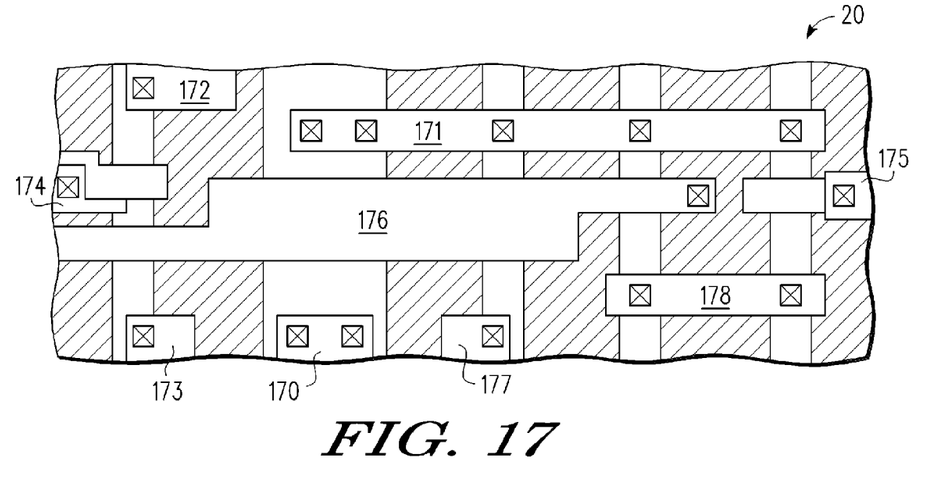
FIG. 17 includes an illustration of a top view of the workpiece of FIG. 16 after forming interconnects.

FIG. 17 includes an illustration of a top view of the workpiece after forming interconnects 170 to 178. Contacts are made to underlying features and are illustrated as boxed Xs. Interconnect 170 can be a physical representation of terminal 210 in FIG. 2. In a particular embodiment, interconnect 170 can be coupled to a $V_{SS}$ rail. Interconnect 171 electrically connects S/D regions of transistors 21, 23, 25, and 26 to one another. In a particular embodiment, interconnect 172, interconnect 173, or both can be coupled to charge-altering terminal(s) that can be used when introducing or removing charge from gate electrode 142 (not illustrated). Interconnect 172 can be a physical representation of terminal 202 in FIG. 2, and interconnect 173 can be a physical representation of terminal 204 in FIG. 2. Interconnect 174 can be part of or electrically connected to select line 224 in FIG. 2. Interconnects 175 and 176 can be part of or electrically connected to pass lines 225 and 226, respectively, in FIG. 2. Interconnect 177 can be a physical representation of terminal 206 in FIG. 2. In a particular embodiment, interconnect 177 can be coupled to a $V_{DD}$ rail. Interconnect 178 can be a physical representation of terminal 208 in FIG. 2. No electrical connections are made to gate electrode 142 because it is allowed to electrically float. Gate electrode 142 is not illustrated in FIG. 17 because it is covered by interconnect 176.

Interconnects 170 to 178 can include one or more different films. Contacts associated with interconnects 170 to 178 can be part of or distinct from interconnects 170 to 178. For example, the contacts can be part of conductive plugs (e.g., tungsten plugs). Interconnects 170 to 178 can principally include aluminum, copper, gold, or the like and may or may not include an adhesion film, a barrier film, an antireflective film, or any combination thereof. Interconnects 170 and 178 can be formed using a conventional or proprietary technique. Additional interconnect levels (not illustrated) can be formed if needed or desired. A passivation layer (not illustrated) can be formed over the last level of interconnects to form a substantially completed electronic device.

Skilled artisans understand that FIGS. 11 to 17 illustrate only one set of embodiments used to form nonvolatile memory cell 20. After reading this specification, skilled artisans will appreciate that many other layouts can be used for nonvolatile memory cell 20. Also, the other nonvolatile memory cells of FIGS. 1 and 3 to 10 will have many different possible layouts. Therefore, the particular locations of well regions, gate electrodes, S/D regions, and interconnect with respect to one another can be varied to meet the needs or desires for a particular application. Thus, the layouts in FIGS. 11 to 17 are merely illustrative and do not limit the scope of the present invention.

Table 1 below includes an exemplary set of voltages that can be used for programming and reading nonvolatile memory cell 20. Other voltages can be used for the nonvolatile memory cell 20 or for other circuits as previously described. In one particular embodiment, a memory array can include nonvolatile memory cell 20 and other memory cells that are substantially mirror images of what is illustrated and described with respect to nonvolatile memory cell 20.

TABLE 1

Exemplary Signals for Programming, Erasing, and Reading

| | Operations | Programming | Erasing | Reading |
|---|---|---|---|---|
| Selected | Select line 224 | 0 V | 11 V | 0 V |
| | Terminal 204 | −3.3 V | 11 V | 0 V |
| | Pass line 225 | 0 V | 0 V | 2.5 V |
| | Pass line 226 | 2.5 V | 2.5 V | 0 V |
| | Output terminal 208 | Float | Float | Sense $V_{out}$ |
| Unselected | Other select lines similar to select line 224 | 2.5 V | | 0 V |
| | Other terminals similar to terminal 204 | 2.5 V | | 0 V |
| | Other pass lines similar to passline 225 | 0 V | 0 V | 0 V |
| | Other pass lines similar to pass line 226 | 2.5 V | 2.5 V | 2.5 V |
| | Other output terminals similar to output terminal 208 | Float | Float | Float |
| Common | Terminal 202 and n-well in which transistors 22 and 24 reside | 2.5 V | 11 V | 0 V |
| | n-well in which transistors 21 and 26 reside | 0 V | 0 V | 2.5 V |
| | Terminal 206 ($V_{in}$) | 0 V | 0 V | 0 V < $V_{in}$ ≦ 2.5 V |

Embodiments described herein are useful in forming faster and more reliable nonvolatile memory cells. Because the charge for the nonvolatile memory cell is being introduced and removed from the floating gate/node via an active region different from another active region used for reading, the characteristics for transistors within the memory cell can be better matched to the function that they are to perform. Programming and erasing operations are relatively slow and can require substantially higher voltages as compared to reading operations. Thus, transistors used in programming and erasing can be tailored for those operations without having to compromise their design for reading, and similarly, transistors used in reading can be tailored for reading without having to compromise their design for reading. The memory cell can operate faster because a transistor within the nonvolatile memory that is used for reading does not require a graded source/drain region. The memory cell is less likely to have read disturb problems because less hot carriers would likely enter the floating gate during reading. Along similar lines, less charge has to pass through the gate dielectric layer for transistors used during reading operations. Therefore, the nonvolatile memory cell can be faster and more reliable as compared to a conventional nonvolatile memory cell where the same active region is used for reading and at least one of the charge altering operations (e.g., programming or erasing).

The process flow for the nonvolatile memory can be simplified because the nonvolatile memory cells can be implemented using a single gate conductor (e.g., single poly) process. Thus, fewer layers are needed as compared to nonvolatile memory cells that have control gate electrodes or merged select/control gate electrodes overlie floating gate electrode. Reducing the number of processing operations increases throughput and yield and decreases costs. Still further, surface roughness of a substrate can increase as the number of oxide layers grown and removed also increases. The nonvolatile memory may use fewer oxide layers to be formed and removed. Therefore, the surface roughness may be less and allow a higher electrical field to be formed across the oxide before breakdown occurs.

Many different aspects and embodiments are possible. Some of those aspects and embodiments are described below. After reading this specification, skilled artisans will appreciate that those aspects and embodiments are only illustrative and do not limit the scope of the present invention.

In a first aspect, a circuit for a nonvolatile memory cell can include a charge-altering terminal and an output terminal configured to provide a signal corresponding to a state of the memory cell when reading the nonvolatile memory cell. The circuit can also include a first transistor including a gate electrode that electrically floats and an active region including a current-carrying electrode, wherein the current-carrying electrode is coupled to the output terminal. The circuit can further include a second transistor including a first electrode and a second electrode, wherein the first electrode is coupled to the gate electrode of the first transistor, and the second electrode is coupled to the charge-altering terminal. The circuit can be designed such that when changing the state of the memory cell, the second transistor would be active and no significant amount of charge carriers would be transferred between the gate electrode of the first transistor and the active region of the first transistor.

In an embodiment of the first aspect, the circuit further includes a third transistor including a current-carrying electrode, wherein the current-carrying electrode of the first transistor and the current-carrying electrode of the third transistor are conductively coupled to each other. In a particular embodiment, the first electrode of the second transistor includes a gate electrode. In a more particular embodiment, the third transistor includes a gate electrode that is conductively coupled to the gate electrode of the first transistor. In another more particular embodiment, the circuit further includes a fourth transistor including a first current-carrying electrode, a second current-carrying electrode, and a gate electrode. The first current-carrying electrode of the fourth transistor is coupled to the current-carrying electrode of the first transistor and the current-carrying electrode of the third transistor, the second current-carrying electrode of the fourth transistor is coupled to the output terminal, and the gate electrode of the fourth transistor is coupled to a first pass line.

In an even more particular embodiment of the first aspect, the circuit further includes a fifth transistor including a first current-carrying electrode, a second current-carrying electrode, and a gate electrode. The first current-carrying electrode of the fifth transistor is coupled to the current-carrying electrode of the first transistor, the current-carrying electrode of the third transistor, and the first current-carrying electrode of the fourth transistor, the second current-carrying electrode of the fifth transistor is coupled to the second current-carrying electrode of the fourth transistor and the output terminal, and the gate electrode of the fifth transistor is coupled to a second pass line. In still an even more particular embodiment, the first transistor, the second transistor, and the fifth transistor are p-channel transistors, and the third transistor and the fourth transistor are n-channel transistors.

In a further particular embodiment of the first aspect, the circuit further includes a fourth transistor including a first current-carrying electrode, a second current-carrying electrode, and a gate electrode. The first current-carrying electrode of the fourth transistor is coupled to the charge altering terminal, the second current-carrying electrode of the fourth transistor is coupled to the second electrode of the second transistor, and the gate electrode of the fourth transistor is coupled to a select line. In a more particular embodiment, the second transistor and the fourth transistor are p-channel transistors.

In another particular embodiment of the first aspect, the first transistor and the third transistor are n-channel transistors or p-channel transistors. In a further particular embodiment, the first electrode of the second transistor includes a gate electrode, and the second electrode of the second transistor includes a current-carrying electrode. The circuit further includes a fourth transistor including a current-carrying electrode and a gate electrode, wherein the current-carrying electrode of the fourth transistor and the current-carrying electrode of the second transistor are coupled to the gate electrode of the first transistor, and the gate electrode of the fourth transistor is coupled to a select line. In a more particular embodiment, the circuit further includes a fifth transistor including a current-carrying electrode and a gate electrode, and a sixth transistor including a current-carrying electrode and a gate electrode. The current carrying electrode of the first transistor and the current carrying electrode of the third transistor are coupled to the gate electrode of the fifth transistor and the gate electrode of the sixth transistor. The current-carrying electrode of the sixth transistor and the current-carrying electrode of the fifth transistor are coupled to each other. In a further embodiment, the first transistor is a p-channel transistor, and the third transistor is an n-channel transistor.

In a second aspect, an electronic device including a nonvolatile memory cell, wherein the nonvolatile memory cell can include a first active region and a second active region spaced apart from the first active region. The electronic device can further include a floating gate electrode including a first portion and a second portion, wherein a first transistor includes the first portion of the floating gate electrode and the first active region, a second transistor includes the second portion of the floating gate electrode and the second active region, and no other gate electrode overlies the floating gate electrode. The electronic device can also include an output terminal coupled to the first transistor and a charge-altering terminal coupled to the second transistor.

In an embodiment of the second aspect, the electronic device further includes a third active region, wherein a third transistor includes a third portion of the floating gate electrode and the third active region, and each of the first and third active regions includes a current-carrying electrode that is coupled to the output terminal. In a particular embodiment, the electronic device further includes a fourth transistor coupled to the second transistor and the charge-altering terminal, and a fifth transistor coupled to the first and third transistors and the output terminal. In a more particular embodiment, the first, second, and fifth transistors are p-channel transistors, and the third and fourth transistors are n-channel transistors.

In a third aspect, a process of forming an electronic device including a nonvolatile memory cell, the process can include forming a field isolation region to define a first active region and a second active region. The process can also include forming a floating gate electrode including a first portion and a second portion, wherein the first portion of the floating gate electrode overlies the first active region, the second portion of the floating gate electrode overlies the second active region, and no other gate electrode overlies the floating gate electrode. The process can further include forming source/drain regions within the first active region and the second active region, wherein a first transistor includes a first pair of spaced-apart source/drain regions within the first active region and the first portion of the floating gate electrode, a second transistor includes a second pair of spaced-apart source/drain regions within the second active region and the second portion of the floating gate electrode, and the memory cell is configured to alter a charge of the floating gate electrode via the second active region, and not the first active region.

In an embodiment of the third aspect, forming the floating gate includes forming a first layer over the field isolation region, the first active region, and the second active region, wherein the first layer includes a semiconductor material, and patterning the first layer to form the floating gate electrode and other gate electrodes, wherein all gate electrodes within the memory cell include the first layer. In a more particular embodiment, patterning the first layer is performed such that the other gate electrodes include a first gate electrode and a second gate electrode, the first gate electrode is part of a pass transistor coupled to the first transistor, and the second gate electrode is part of a select transistor coupled to the second transistor.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

Many other embodiments may be apparent to those of skill in the art upon reviewing the disclosure. Other embodiments may be used or derived from the disclosure, such that a structural substitution, logical substitution, or another change may be made without departing from the scope of the disclosure. Although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description. It is to be appreciated that certain features are, for clarity, described herein in the context of separate embodiments, may also be provided in combination in a single embodiment. Conversely, various features that are, for brevity, described in the context of a single embodiment, may also be provided separately or in any subcombination. Further, reference to values stated in ranges includes each and every value within that range.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A circuit for a nonvolatile memory cell comprising:
   a charge-altering terminal;
   an output terminal configured to provide a signal corresponding to a state of the memory cell when reading the nonvolatile memory cell;
   a first transistor including a gate electrode that electrically floats and an active region including a current-carrying electrode, wherein the current-carrying electrode is coupled to the output terminal; and
   a second transistor including a first electrode and a second electrode, wherein the first electrode is coupled to the gate electrode of the first transistor, and the second electrode is coupled to the charge-altering terminal,
   wherein the circuit is designed such that when changing the state of the memory cell, the second transistor would be active and no significant amount of charge carriers would be transferred between the gate electrode of the first transistor and the active region of the first transistor.

2. The circuit of claim 1, further comprising a third transistor including a current-carrying electrode, wherein the current-carrying electrode of the first transistor and the current-carrying electrode of the third transistor are conductively coupled to each other.

3. The circuit of claim 2, wherein the first electrode of the second transistor includes a gate electrode.

4. The circuit of claim 3, wherein the third transistor includes a gate electrode that is conductively coupled to the gate electrode of the first transistor.

5. The circuit of claim 3, wherein:
   the circuit further comprising a fourth transistor including a first current-carrying electrode, a second current-carrying electrode, and a gate electrode;
   the first current-carrying electrode of the fourth transistor is coupled to the current-carrying electrode of the first transistor and the current-carrying electrode of the third transistor;
   the second current-carrying electrode of the fourth transistor is coupled to the output terminal; and
   the gate electrode of the fourth transistor is coupled to a first pass line.

6. The circuit of claim 5, further comprising a fifth transistor including a first current-carrying electrode, a second current-carrying electrode, and a gate electrode, wherein:
   the first current-carrying electrode of the fifth transistor is coupled to the current-carrying electrode of the first transistor, the current-carrying electrode of the third transistor, and the first current-carrying electrode of the fourth transistor;

the second current-carrying electrode of the fifth transistor is coupled to the second current-carrying electrode of the fourth transistor and the output terminal; and the gate electrode of the fifth transistor is coupled to a second pass line.

7. The circuit of claim 6, wherein the first transistor, the second transistor, and the fifth transistor are p-channel transistors, and the third transistor and the fourth transistor are n-channel transistors.

8. The circuit of claim 3, further comprising a fourth transistor including a first current-carrying electrode, a second current-carrying electrode, and a gate electrode, wherein:

the first current-carrying electrode of the fourth transistor is coupled to the charge altering terminal;

the second current-carrying electrode of the fourth transistor is coupled to the second electrode of the second transistor; and the gate electrode of the fourth transistor is coupled to a select line.

9. The circuit of claim 8, wherein the second transistor and the fourth transistor are p-channel transistors.

10. The circuit of claim 2, wherein the first transistor and the third transistor are n-channel transistors or p-channel transistors.

11. The circuit of claim 2, wherein:

the first electrode of the second transistor includes a gate electrode, and the second electrode of the second transistor includes a current-carrying electrode; and the circuit further comprises a fourth transistor including a current-carrying electrode and a gate electrode, wherein:

the current-carrying electrode of the fourth transistor and the current-carrying electrode of the second transistor are coupled to the gate electrode of the first transistor; and the gate electrode of the fourth transistor is coupled to a select line.

12. The circuit of claim 11, further comprising:

a fifth transistor including a current-carrying electrode and a gate electrode; and a sixth transistor including a current-carrying electrode and a gate electrode, wherein:

the current carrying electrode of the first transistor and the current carrying electrode of the third transistor are coupled to the gate electrode of the fifth transistor and the gate electrode of the sixth transistor; and the current-carrying electrode of the sixth transistor and the current-carrying electrode of the fifth transistor are coupled to each other.

13. The circuit of claim 2, wherein the first transistor is a p-channel transistor, and the third transistor is an n-channel transistor.

14. An electronic device including a nonvolatile memory cell, wherein the nonvolatile memory cell comprises:

a first active region;

a second active region spaced apart from the first active region;

a floating gate electrode including a first portion and a second portion, wherein:

a first transistor includes the first portion of the floating gate electrode and the first active region;

a second transistor includes the second portion of the floating gate electrode and the second active region; and no other gate electrode overlies the floating gate electrode;

an output terminal coupled to the first transistor; and a charge-altering terminal coupled to the second transistor.

15. The electronic device of claim 14, further comprising a third active region, wherein:

a third transistor includes a third portion of the floating gate electrode and the third active region; and each of the first and third active regions includes a current-carrying electrode that is coupled to the output terminal.

16. The electronic device of claim 15, further comprising:

a fourth transistor coupled to the second transistor and the charge-altering terminal; and a fifth transistor coupled to the first and third transistors and the output terminal.

17. The electronic device of claim 16, wherein:

the first, second, and fifth transistors are p-channel transistors; and the third and fourth transistors are n-channel transistors.

18. A process of forming an electronic device including a nonvolatile memory cell, the process comprising:

forming a field isolation region to define a first active region and a second active region;

forming a floating gate electrode including a first portion and a second portion, wherein:

the first portion of the floating gate electrode overlies the first active region;

the second portion of the floating gate electrode overlies the second active region; and no other gate electrode overlies the floating gate electrode; and forming source/drain regions within the first active region and the second active region, wherein:

a first transistor includes a first pair of spaced-apart source/drain regions within the first active region and the first portion of the floating gate electrode;

a second transistor includes a second pair of spaced-apart source/drain regions within the second active region and the second portion of the floating gate electrode; and the memory cell is configured to alter a charge of the floating gate electrode via the second active region, and not the first active region.

19. The process of claim 18, wherein forming the floating gate comprises:

forming a first layer over the field isolation region, the first active region, and the second active region, wherein the first layer includes a semiconductor material; and patterning the first layer to form the floating gate electrode and other gate electrodes, wherein all gate electrodes within the memory cell include the first layer.

20. The process of claim 19, wherein:

patterning the first layer is performed such that the other gate electrodes include a first gate electrode and a second gate electrode;

the first gate electrode is part of a pass transistor coupled to the first transistor; and the second gate electrode is part of a select transistor coupled to the second transistor.

* * * * *